United States Patent [19]

Kaminski

[11] 4,316,148
[45] Feb. 16, 1982

[54] VARIABLE FREQUENCY LOGIC CLOCK

[75] Inventor: David G. Kaminski, Bloomington, Minn.

[73] Assignee: Sperry Corporation, New York, N.Y.

[21] Appl. No.: 71,810

[22] Filed: Sep. 4, 1979

[51] Int. Cl.³ ............................................. H03K 3/017
[52] U.S. Cl. ........................................ 328/55; 328/63; 328/119; 328/152
[58] Field of Search .................... 328/63, 55, 119, 152

[56] References Cited

U.S. PATENT DOCUMENTS 4,165,490  8/1979  Howe et al. .......................... 328/63

Primary Examiner—Eli Lieberman
Attorney, Agent, or Firm—Douglas L. Tschida; Kenneth T. Grace; William E. Cleaver

[57] ABSTRACT

A logic clock signal generator implemented with delay lines having a plurality of taps, wherein the taps are selectively feedback coupled to the input to produce a clock signal having a plurality of selectively variable time periods.

4 Claims, 5 Drawing Figures

VARIABLE FREQUENCY LOGIC CLOCK

BACKGROUND OF THE INVENTION

The present invention relates to signal generators and more specifically to a generator for producing clock signals used to time the logic operations within a computer. Typically such generators consist of a crystal oscillator and counter for producing clock signals of different periods depending on the count information.

The present invention, however, teaches a variable frequency delay line clock having a number of different clock frequencies which can be machine selected on a cycle to cycle basis depending on the specific operation being performed. With such a clock signal generator, the period of each clock cycle can be varied to enable the effects of a clock signal transition to ripple through the computer before the next clock period. Examples of operations requiring differing clock periods are an ADD, which requires additional time due to the carry delays, as opposed to an EXCLUSIVE OR, which does not. The present clock signal generator therefore allows the computer to adjust the timing of its operations to minimize its computational time and not be dependent on the worst case time path of any one operation.

SUMMARY OF THE INVENTION

The present invention is directed to a delay line implementation of a variable frequency logic clock, wherein one or more delay lines are coupled in series to provide a plurality of taps from which time variant signals can be obtained. The taps are selectively feedback coupled via a logic decoder to the input of the first delay line to produce a cyclical clock signal and enable the synchronous variation of the clock signal's period. The period of each cycle of the clock signal is comprised of an active time and a variable inactive time with the total time being dependent upon which tap is selected and with selection occurs under microprogram or other synchronous control. Depending upon the tap selection, the clock signal's period is thus selectively variable for a number of different machine operations requiring differing clock periods.

DESCRIPTION OF THE PREFERRED EMBODIMENT

Figure 1:
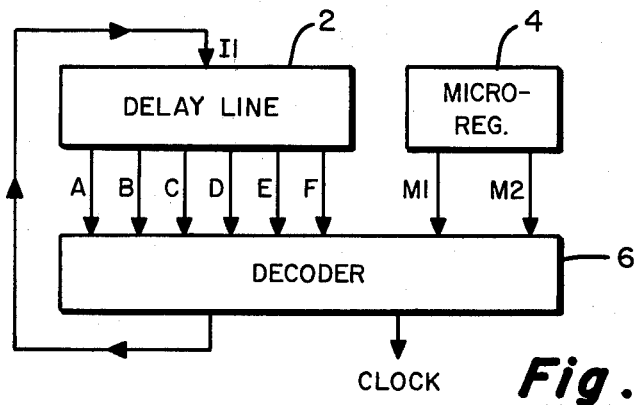
FIG. 1 is a block diagram of the logic clock comprised of a delay line, decoder and micro instruction register.

The present invention will now be described with reference to FIG. 1 and which depicts a variable frequency clock signal generator comprised of a delay line 2 having a plurality of time variant taps A, B, C, D, E and F with respect to the input I1. The taps are coupled to a decoder 6 which is used to decode the micro-instruction signals M1 and M2 from the micro-instruction register 4 and cause a delayed logic signal from a selected tap to be fedback to the input I1. Thus depending upon the specific micro-instruction, a cyclical clock signal having a selectively variable period comprised of an active time (i.e. first interval) of fixed duration and an inactive time of variable duration will be produced.

Figure 2:
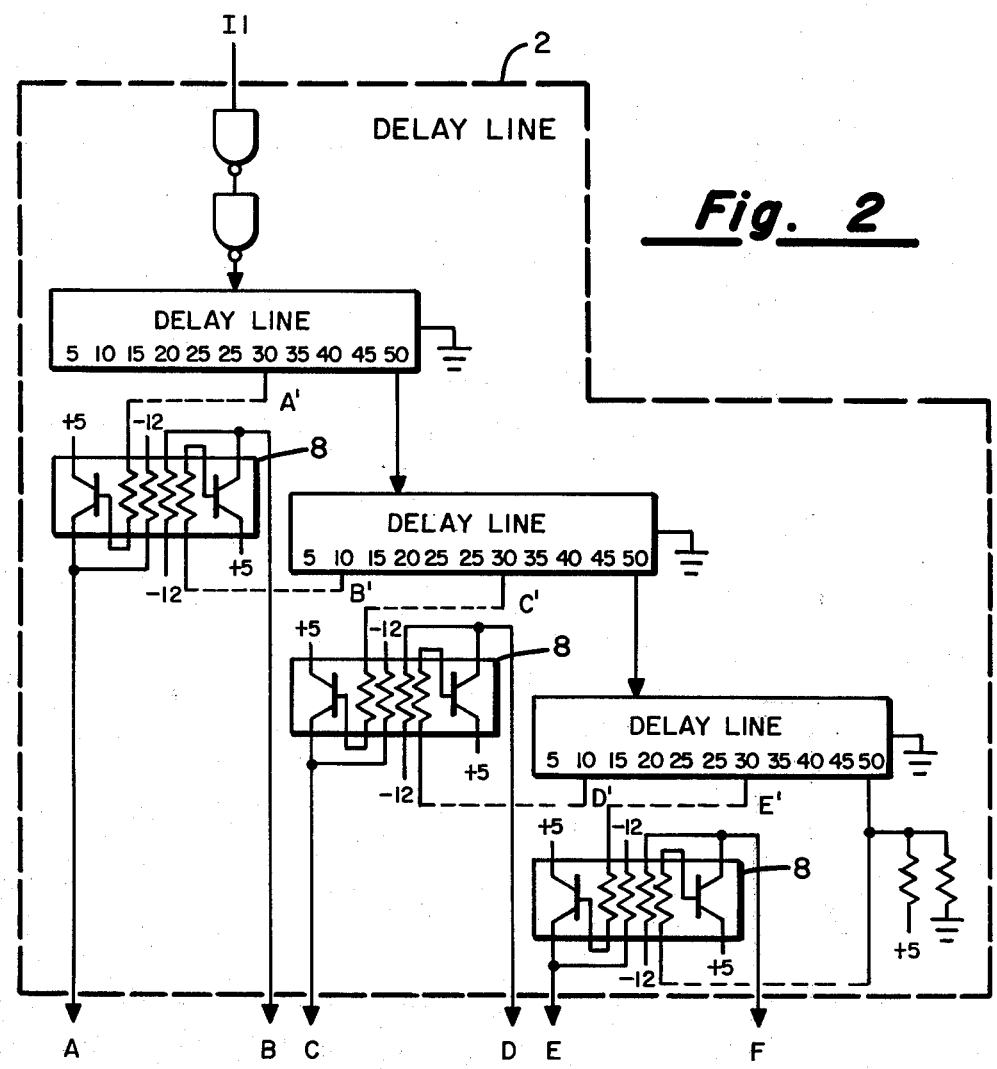
FIG. 2 is a schematic diagram of the delay line of FIG. 1 with buffered inputs and outputs.

Referring to FIG. 2, delay line 2 is comprised of three identical 50 nsec delay lines coupled in series with the output of the last tap of each delay line coupled to the input of the next delay line. Each delay line has a number of taps with each tap providing a specific time delay with respect to the input terminal I1 of the first delay line. In the present embodiment, a single tap A' is used on the first delay line, two taps B' and C' on the second delay line, and three taps D', E' and F' on the last delay line. Each tap output also being buffered through an identical driver 8, which driver 8 acts to amplify the A', B', C', D', E' and F' outputs and to minimize the load impedance on the tap output signal. For the present delay lines, Table I indicates the time delays at the driver 8 outputs A, B, C, D, E and F with respect to terminal I1. It is to be recognized, however, that due to delays in the other active components, such as the buffers and logic gates, the tap selection timing may have to be adjusted to achieve any given design and delay requirements.

TABLE I

| Outputs | Time |
| --- | --- |
| A | 30 nsec |
| B | 60 nsec |
| C | 90 nsec |
| D | 110 nsec |
| E | 130 nsec |
| F | 150 nsec |

Figure 3:
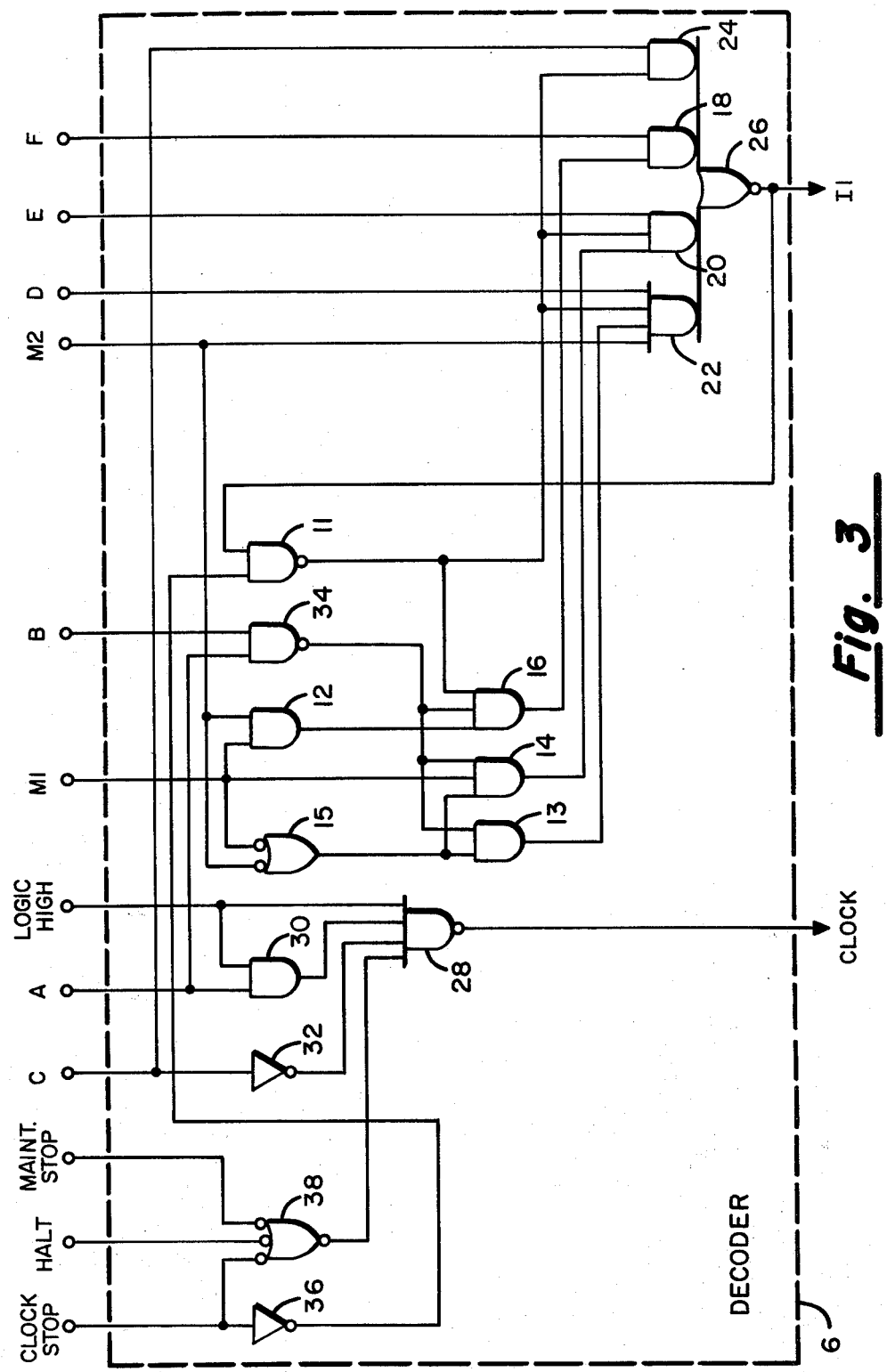
FIG. 3 is a schematic diagram of the decoder of FIG. 1 used to select the frequency of the clock signal with a "hi" propagating down the delay line.

Decoder 6 is comprised of the detailed logic circuitry of FIG. 3 and operates to select tap C, D, E or F depending upon the inputs M1 and M2 from the micro-instruction register 4. The specific selection code used in the present embodiment is set forth in Table II, but it is to be recognized that other codes are possible depending on the time granularity required. The specific timing associated with each code is further dependent on the machine operation that is performed, and thus the contents of micro-instruction register 4 will vary with the minimum timing required for each computer operation.

TABLE II

| M1 | M2 | Tap |
| --- | --- | --- |
| lo | lo | C |
| lo | hi | D |
| hi | lo | E |
| hi | hi | F |

Figure 4:
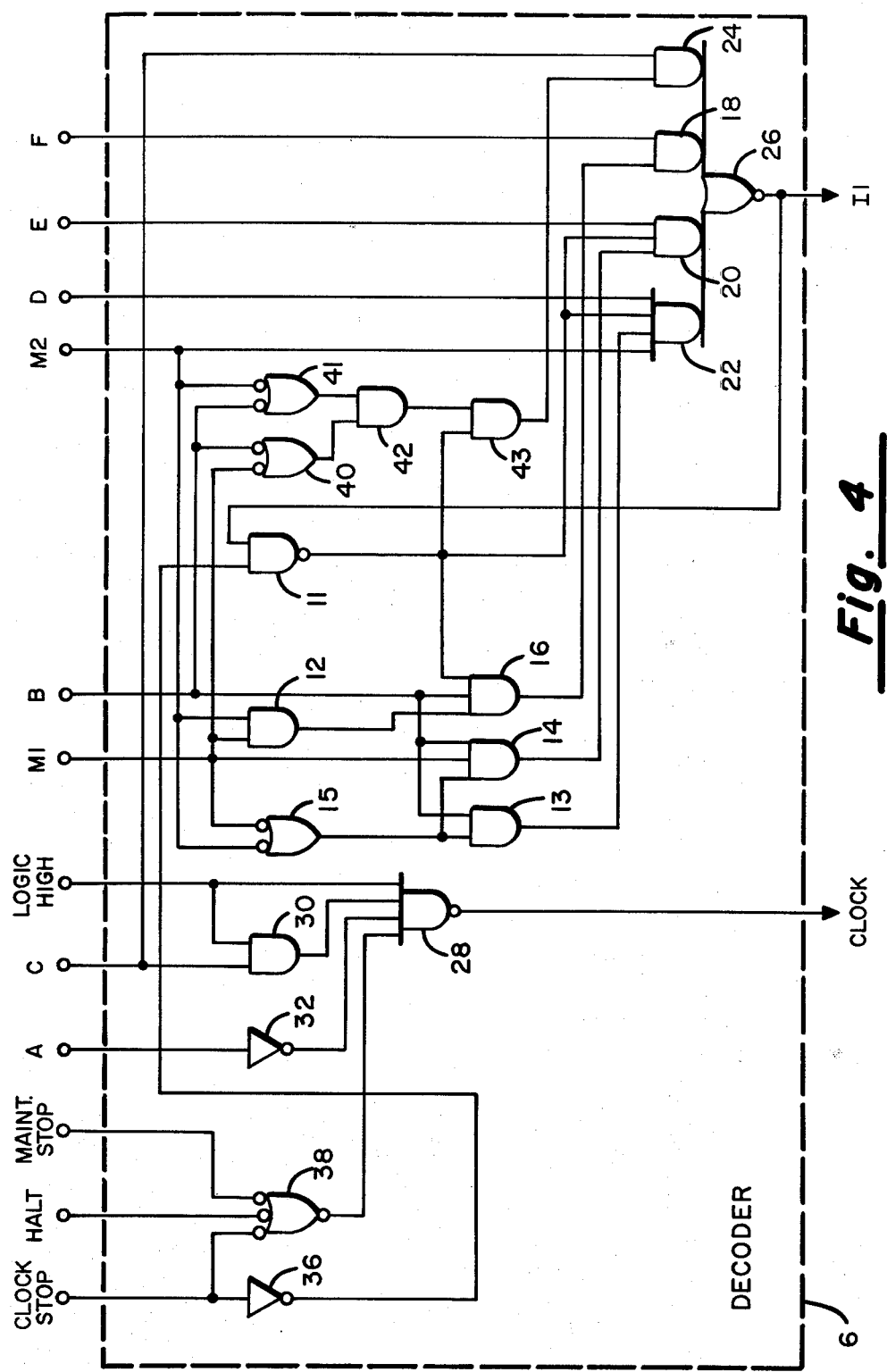
FIG. 4 is a schematic diagram of the decoder of FIG. 1 used to select the frequency of the clock signal with a "lo" propagating down the delay line.
Figure 5:
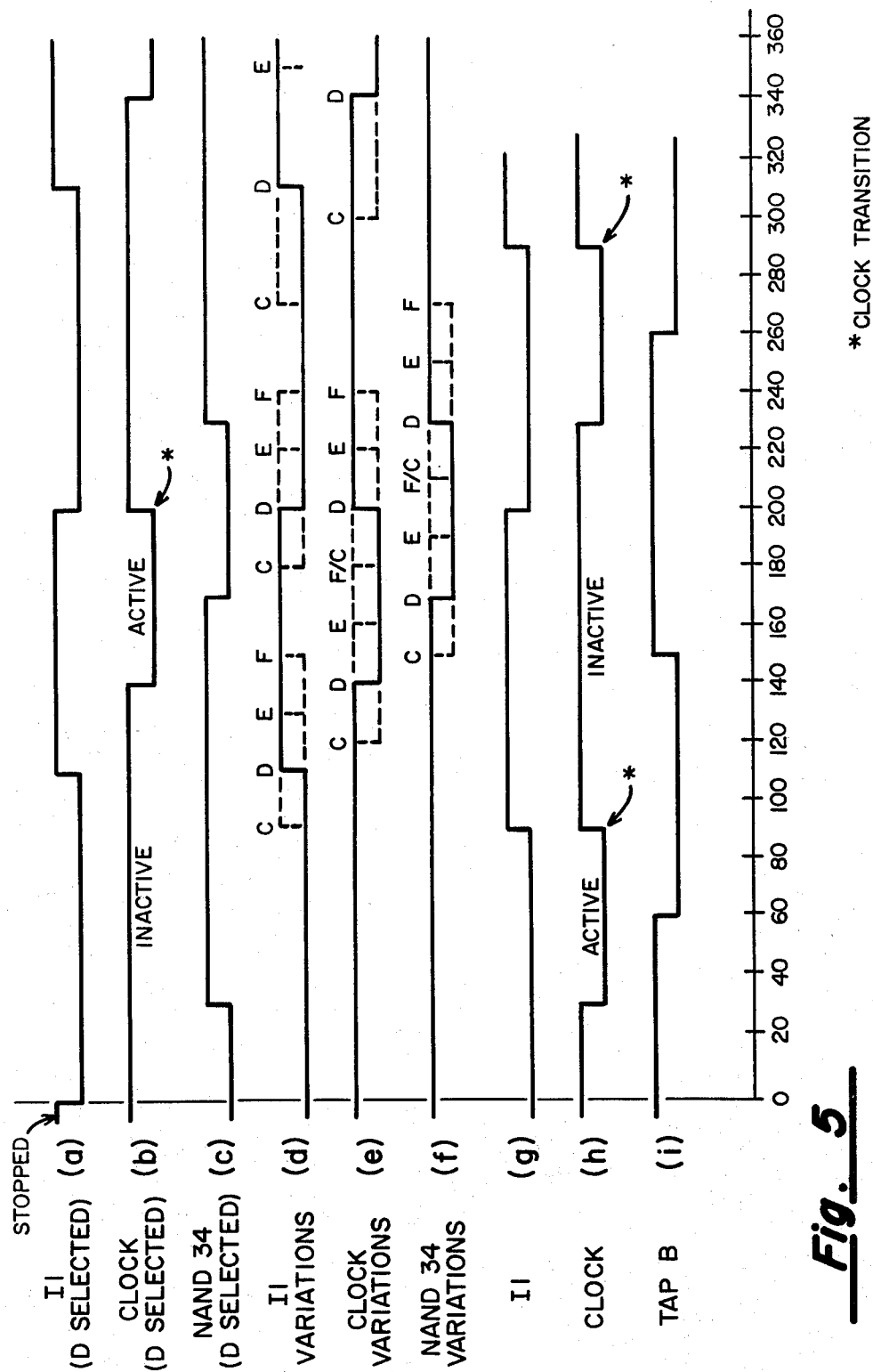
FIG. 5 is a timing diagram of the operation of the logic circuitry of FIGS. 3 and 4.

Prior to discussing the operation of the present embodiments of the clock signal generator, attention should also be directed to the timing diagram of FIG. 5 wherein various timing characteristics associated with FIGS. 3 and 4 are shown. The individual signal characteristics are shown with respect to time with the solid lines indicating the signals for a "D" tap select and the dotted lines indicating the other possible tap selections.

Referring now to FIG. 3, the typical sequence of events that occurs for each clock cycle will be described with reference to selection of the 200 nsec clock period characteristic of the D tap. Assuming the clock is operative with a logic "lo" on the input to NAND gate 11 and that M1 and M2 are respectively set at a logic "lo" and a logic "hi", the "lo" on M1 causes AND gates 12 and 14 to each produce a logic "lo", irrespective of their other inputs, which "lo's" cause AND gates 16, 18 and 20 to each produce a logic "lo". At the same time the "hi" on M2 and the "hi" output of NAND gate 11 (due to the "lo" clock stop input) enable the output of AND gate 22 to be the logical AND of the D tap and the output of AND gate 13. The output of AND gate 13, however, is controlled by the output of NAND gate 34, since the output of NAND gate 15 is at a logic "hi" due to the "lo" on M1.

Before continuing the description of the operation of the clock with respect to the propagation of a signal on I1 down delay line 2, it is to be recognized that if the clock previously had been stopped, each of taps A, B, C, D, E and F would be at a logic "hi". If the clock hadn't been stopped, taps A, B and C would be at a logic "hi" and taps D, E and F would be at a logic "lo" on the completion of the previous clock cycle. In either case, taps E and F have no effect on the clock's operation due to the "lo" on M1 which causes the outputs of AND gates 18 and 20 to each be held at a "lo". Initially, the "lo" on tap D also has no effect due to the "hi's" from taps A and B which hold the output of NAND gate 34 at a "lo", thus causing AND gates 13 and 22 to produce "lo's". The "hi" on tap C, however, with the "hi" from NAND gate 11, causes AND gate 24 to produce a "hi" and NOR gate 26 to produce a "lo", irrespective of the "lo's" from AND gates 18, 20 and 22, which is impressed on I1.

Referring now to FIG. 5, waveforms a, c, d and f, as the "lo" propagates down delay line 2 during the clock's inactive time with D selected, upon reaching tap A, the "lo" causes NAND gate 34 to produce a "hi" on the input to AND gate 22. The "hi" input, however, doesn't affect I1, since the "hi" on tap C is still causing I1 to be "lo". When the "lo" propagates to tap C, AND gate 24 switches to a "lo"; I1 still remains "lo" though due to the "hi" on tap D. When the "lo" propagates to tap D, however, the "lo's" from AND gates 18, 20, 22 and 24 cause NOR gate 26 to produce a "hi" on I1. Tap D has thus controlled the effective length of the delay line during the majority of the clock's inactive time. The propagation of the "hi" on I1 during the remainder of the clock's inactive time and all of the active time will be described next.

When the "hi" on I1 propagates past tap A and reaches tap B, the "hi" inputs from taps A and B cause NAND gate 34 to switch to a "lo". The "lo" then causes AND gate 22 to produce a "lo" on its output, regardless of its other inputs, but I1 stays "hi", since all the inputs to NOR gate 26 remain "lo". Once the "hi" reaches tap C, AND gate 24 produces a "hi" and causes NOR gate 26 to switch to a "lo", and the "lo" then propagates down delay line 2 in the manner previously described. The time duration for the propagation of the "hi" on I1 is thus determined by tap C irrespective of M1 and M2 or tap D, with the total cycle time for I1 being 200 nsec, 110 nsec for the "lo" and "90" nsec for the "hi", which cycle time will continue as long as D remains selected. In a similar manner, taps C, E or F can also be selected by varying the inputs M1 and M2 according to Table II which will cause the input I1 to cycle at a total time period fixed by the tap selected (i.e., 180, 220 or 240 nsec).

While delay line 2 is cycling at a 200 nsec period, the clock signal on the output of AND gate 28 will cycle in a similar manner with the A and C tap inputs to AND gate 30 and inverter 32 determining the duration of the active and inactive times. Referring to FIG. 5, waveforms a, b and c, while the "hi" on I1 is propagating down the delay line 2 with each of the A, B, C, D, E and F taps at a "lo" from the previous I1 cycle and the clock output at a "hi", as tap A switches "hi" after 30 nsec, AND gate 30 produces a "hi" and inverter 32 inverts the "lo" from tap C to produce a "hi", which "hi" inputs cause NAND gate 28 to produce a "lo" on the clock output, thus terminating the inactive time. The "lo" clock will continue during the active time for the next 60 nsec until the "hi" progagating down delay line 2 reaches tap C and causes AND gate 28 to switch "hi". With tap C going "hi", I1 will also switch in the manner described previously to a "lo" and the output of NAND gate 28 will not be affected until the next active period, when tap A switches to a "hi" while tap C is "lo", which condition will occur 200 nsec later, assuming tap D remains selected for the next cycle. The inactive time of the clock cycle is thus dependent on the M1, M2 tap selection and is either 120, 140, 160 or 180 nsec depending on whether tap C, D, E or F is selected.

For the present design, the "lo" to "hi" clock transition at the end of the 60 nsec active time initiates a logic operation (i.e., add, subtract, and, or, exclusive or, etc.) in the computer which operation continues until the "lo" to "hi" transition initiating the next clock period. Such operations generally are performed under microprogram control and require different amounts of time. The present clock signal generator thus enables the variation of the clock signal's period in a compatible hardware design to accommodate the computer's operational time requirements and not waste time, which waste occurs with a fixed frequency logic clock designed for the worst case time path.

Additional features of the present design will now be described. Referring to FIG. 5, waveform c, it is to be noted that the operation of NAND gate 34 provides a time window which brackets the transition of the clock signal at the end of the active time, and the duration of which window is dependent on the propagation of the I1 signals with respect to the A and B taps. The time window is used to prevent spurious clock signal activity which might occur if the micro-instruction code changes are not synchronized with the clock signal transitions. Such asynchronous operation can occur with component mismatch or if the D, E or F taps were subjected to spurious signals or signals of indeterminate logic levels. Typically such micro-instruction changes occur prior to or at the same time as the clock transition and any spurious signals would not be expected.

The time window is generated when a "hi" on I1 reaches tap B which causes NAND gate 34 to produce a "lo" which "lo" will continue until the "lo" on I1, resulting from the clock transition at tap C, reaches tap A and NAND gate 34 again goes "hi". The "lo" from NAND gate 34 forces AND gates 18, 20 and 24 to produce "lo's" during the active time, irrespective of their other inputs, and thus block any of the above mentioned problems.

While the preferred embodiment is designed to have the clock signal transition occur while I1 is "hi", it may be desirable in a different design situation to clock the logic operations with a "lo" on I1, in which case the logic circuitry of FIG. 3 would be modified in the manner of FIG. 4. Referring to FIGS. 4 and 5, waveforms g, h and i with tap D selected, the clock transition for this embodiment occurs while a "lo" is on I1 when the logic condition $\overline{A} \cdot C$ is met on the inputs to NAND gate 28. The time window provided previously by NAND gate 34 is now provided by the operation of NAND gates 40 and 41 and AND gates 42 and 43 in response to the I1 signals with respect to tap B. FIG. 5, waveform i shows the time window again bracketing the clock transition but its function now has greater significance, since a micro-instruction change after the clock transition, at any time up until the "hi" on I1 has reached the end of delay line 2, could cause I1 to prematurely go "lo" and thus produce a spurious clock transition on subsequently switching to a "hi". The clock generator is, however, constrained by the logic gates 40, 41, 42 and 43 to force the clock transition when the "lo" reaches tap C and hold tap B "lo" for 60 nsec after the clock transition (i.e., the time it would take the I1 "hi" to reach tap F) and thus prevent any late micro-instruction changes from affecting the duration of the inactive period.

It is also to be note that the asynchronous stopping of the clocks of FIGS. 3 and 4 are controlled by feeding the signal from NOR gate 26 back on NAND gate 11. The feedback prevents the immediate stopping of the clock should the other input to NAND gate 11 switch to a "hi", due to a "lo" on the clock stop input to INVERTER 36 or the halt or maintenance stop inputs to OR gate 38, while a "lo" is propagating down the delay line. This logic arrangement thus prevents the interruption of a clock period should a stop signal occur during the clock period and insures the completion of the machine function which is being timed with the clock signal.

It is to be further noted that the present design permits the independent stopping of the clock signal by impressing a "lo" on the clock halt or maintenance stop inputs to OR gate 38. This feature enables the stopping of the clock output without interrupting the operation of the delay line 2 and decoder 6, thus permitting other fixed time functions which may be dependent on the other taps of the delay line 2 to continue uninterrupted.

While the present invention has been described with reference to specific embodiments with the clock transition occurring for either a "lo" or a "hi" propagating down delay line 2, it is to be noted that other embodiments may be suggested those skilled in the art without departing from the spirit and scope of the claimed invention.

What is claimed is:

1. A clock signal generator, comprising:
   delay line means having an input terminal and a plurality of output terminals for producing a plurality of time variant output signals on said output terminals as an input signal propagates down said delay line;
   a decoder comprising,
     means for feedback coupling one of said output terminals to said input terminal, thereby producing a cyclical clock signal and
     means for dividing the period of said cyclical clock signal into at least first and second time intervals; and
     means for selectively controlling which of said output terminals is feedback coupled to said input terminal from cycle to cycle of said clock signal, thereby controlling the period of said clock signal and the duration of the first and second time intervals for each cycle of said clock signal.

2. A clock signal generator as set forth in claim 1 including means for preventing said selective control means from changing the period of said clock signal once a cycle has started, until the beginning of the next cycle of said clock signal.

3. A clock signal generator as set forth in claim 1 or 2 including:
   means for stopping said clock signal only at the end of each cycle of said clock signal.

4. A clock signal generator as set forth in claim 3 including means for stopping said clock signal without stopping said delay line means, thereby enabling said output signals to continue irrespective of said clock signal.

* * * * *